(12) United States Patent  
O'Daniel et al.

(10) Patent No.: US 7,450,623 B2
(45) Date of Patent: Nov. 11, 2008

(54) WAVELENGTH LOCKED LASER INCLUDING INTEGRATED WAVELENGTH SELECTING TOTAL INTERNAL REFLECTION (TIR) STRUCTURE

(75) Inventors: Jason Kirk O'Daniel, Winter Park, FL (US); Eric Gordon Johnson, Oviedo, FL (US); Oleg Smolski, Oviedo, FL (US)

(73) Assignee: Eric G. Johnson, Harrisburg, NC (US)

( * ) Notice: Subject to any disclaimer, the term of this patent is extended or adjusted under 35 U.S.C. 154(b) by 3 days.

(21) Appl. No.: 11/104,139

(22) Filed: Apr. 12, 2005

(65) Prior Publication Data
US 2006/0227833 A1 Oct. 12, 2006

(51) Int. Cl.
*H01S 5/00* (2006.01)
(52) U.S. Cl. .................................. 372/50.11
(58) Field of Classification Search ............... 372/50.11
See application file for complete search history.

(56) References Cited

U.S. PATENT DOCUMENTS

| | | | |
|---|---|---|---|
| 4,792,962 A * | 12/1988 | Miyauchi et al. .............. 372/94 |
| 4,956,844 A * | 9/1990 | Goodhue et al. ....... 372/44.011 |
| 5,069,545 A | 12/1991 | Hinz |
| 5,228,103 A * | 7/1993 | Chen et al. ..................... 385/14 |
| 5,231,642 A * | 7/1993 | Scifres et al. ............ 372/45.01 |
| 5,373,519 A * | 12/1994 | Siono et al. .............. 372/50.11 |
| 5,870,417 A * | 2/1999 | Verdiell et al. ................. 372/32 |
| 2002/0003824 A1* | 1/2002 | Lo et al. ....................... 372/50 |
| 2002/0176151 A1* | 11/2002 | Moon et al. ................. 359/298 |
| 2004/0141540 A1 | 7/2004 | Masood et al. |
| 2004/0165637 A1* | 8/2004 | Bullington et al. ............ 372/50 |
| 2005/0008294 A1 | 1/2005 | Park et al. |

* cited by examiner

*Primary Examiner*—Minsun Harvey
*Assistant Examiner*—Sean Hagan
(74) *Attorney, Agent, or Firm*—Darby & Darby PC

(57) ABSTRACT

An integrated light emitting semiconductor device having integrated feedback for wavelength locking comprises a semiconductor substrate including a waveguide region having a gain section having a gain media therein, and an out-coupling perturbation integrated with the device disposed proximate to the waveguide. A total internal reflection (TIR) structure for providing optical feedback is integrated with the device and disposed in a spaced apart relation relative to the out-coupling perturbation. At least one of the out-coupling perturbation and the TIR structure include a grating or prism to provide dispersion to send different wavelengths of light in different directions. The out-coupling perturbation is preferably a grating that has a grating period that is small enough to allow for only the +1 diffracted order to propagate.

16 Claims, 11 Drawing Sheets

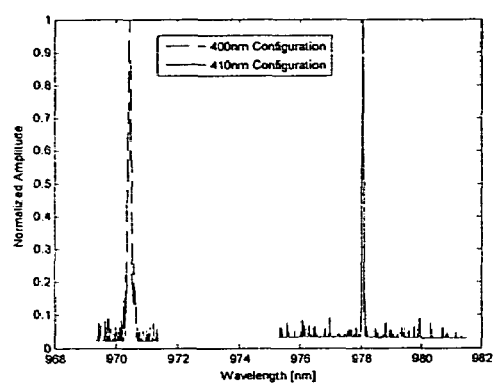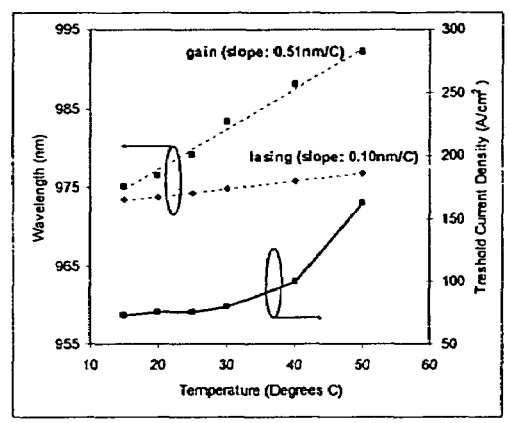
FIG. 7                                    FIG. 8

WAVELENGTH LOCKED LASER INCLUDING INTEGRATED WAVELENGTH SELECTING TOTAL INTERNAL REFLECTION (TIR) STRUCTURE

CROSS-REFERENCE TO RELATED APPLICATIONS

Not applicable.

STATEMENT REGARDING FEDERALLY SPONSORED RESEARCH OR DEVELOPMENT

Not applicable.

FIELD OF THE INVENTION

The invention relates to integrated solid state lasers having integrated wavelength locking arrangements.

BACKGROUND AND PRIOR ART

Lasers are resonators which contain an amplifying medium that functions to increase the intensity of the light that passes through it. The amplifying medium may be a solid, liquid or a gas. For example, in a neodymium YAG (Nd:YAG) laser, the amplifying medium is a solid rod of yttrium aluminum gamate (YAG) containing neodymium ions. Another example of a solid state laser is a laser diode. In a laser diode, also known as a diode laser or semiconductor laser, a semiconductor junction is sandwiched between a p-type semiconductor layer and an n-type layer semiconductor layer. Laser diodes are generally electrically pumped by passing an electric current across the p-n junction.

Without locking, certain lasers provide too wide a spontaneous emission spectrum line width for some applications or they provide emission spectrum lines that hop from one wavelength to another in response to small changes in environmental conditions, such as temperature. The diode laser is one such laser. The result is a need for wavelength locking filters for applications which require precise control of the laser output. These filters have high transmittance at the desired wavelength and very steep cut-off at adjacent wavelengths.

Thus, wavelength locking of light emitting semiconductor devices provides selection of only light of a specific wavelength (generally the fundamental wavelength) from within the spontaneous emission spectrum of a device to be injected or reflected back into the gain region of the device, thereby "locking" the laser output. Wavelength locking can be implemented using external configurations, such as an external cavity including a Fabry-Perot filter, or using internal (integrated) configurations. As used herein, the term "integrated" refers to a one piece article beginning with a bulk substrate material (such as a Si or GaAs wafer) which includes deposited and doped regions, lithographically defined regions, etched regions and etched and filled regions, formed using integrated circuit processing techniques. Integral members may be contrasted with devices or articles which include a plurality of separate and non-integrated components.

One common example of integrated wavelength locking of semiconductor lasers is using distributed feedback lasers (DFB), in which a Bragg grating is fabricated over the entire length of the gain section. Another common example is the distributed Bragg reflector (DBR), in which a pair of Bragg gratings is fabricated in a passive region on both sides of the gain section of the device to provide optical feedback.

SUMMARY OF THE INVENTION

An integrated light emitting semiconductor device having integrated feedback for wavelength locking comprises a semiconductor substrate including a waveguide region having a gain section including a gain media therein, and an out-coupling perturbation or mirror integrated with the device disposed proximate to the waveguide. The mirror can be a MEMS mirror, such as a MEMS turning mirror having an optional highly reflective coating layer disposed thereon.

The preferred out-coupling perturbation is disposed sufficiently close to the waveguide region to transform the waveguide mode into a propagating mode in the substrate. The out-coupling perturbation can be an out-coupling grating, or leaky mode coupling waveguide. The out-coupling perturbation is preferably an out-coupling grating having a grating period that is small enough to allow for only the +1 diffracted order to propagate into the substrate.

A total internal reflection (TIR) structure for providing optical feedback is integrated with the device and disposed in a spaced apart relation relative to the out-coupling perturbation or mirror. At least one of the out-coupling perturbation and the TIR structure comprise an integrated grating or prism to provide dispersion so that different wavelengths leave the prism or grating at different angles to provide wavelength selectivity. The TIR structure can include a grating having a grating period such that essentially a single wavelength from a plurality of wavelengths reflected by the out-coupling perturbation is retroreflected back to the gain section.

The combination of an out-coupling perturbation or mirror and TIR feedback structure results in the wavelength retroreflected from the TIR feedback structure to be coupled back into the gain section of the device, while all other wavelengths are scattered away, thus providing a narrow emission line width. As described in the Examples, line widths of 0.12 nm or less for laser diodes according to the invention have been demonstrated.

The gain section can include a p-n junction to form a laser diode, or utilize various other solid state gain media including quantum dots or at least one quantum well. The device can be a grating-coupled surface-emitting laser (GCSEL).

In one embodiment, the out-coupling perturbation and the TIR structure are disposed on one side of the gain section. The device can further comprise a reflective/transmissive device integrated on the device selected from another out-coupling perturbation, a cleaved facet, a cleaved facet with an antireflection coating, another outcoupling perturbation and TIR structure, and another outcoupling perturbation and TIR structure followed by an out-coupling perturbation or cleaved facet with antireflection coating.

The out-coupling perturbation and the TIR structure can be curved. A period of at least one of the out-coupling perturbation and the TIR structure can include at least two different periods, wherein the device provides a wavelength dependent phase and at least two different wavelength are retroreflected back into the gain section. At least one of the out-coupling perturbation and the TIR structure can include spatial variations, the spatial variations comprising variations in at least one of etch depth, period, an duty cycle, to spatially condition a beam reflected back into a laser cavity of the device.

BRIEF DESCRIPTION OF FIGURES

There is shown in the drawings embodiments which are presently preferred, it being understood, however, that the invention can be embodied in other forms without departing from the spirit or essential attributes thereof.

FIG. 1(a) shows a cross sectional view of a surface emitting diode laser having a pair of gratings in passive region adjacent to the gain section of the laser, according to an embodiment of the invention, while

FIG. 7 shows spectral data for wavelength locking configurations using a 400 nm TIR grating period and a 410 nm TIR grating period.

FIG. 8 shows lasing threshold and spectral characteristics (lasing center and spontaneous emission red edge) versus temperature for a 100 μm-wide by 4 mm-long device with a 410 nm-periodicity TIR grating.

DESCRIPTION OF THE PREFERRED EMBODIMENT

Figure 1A:
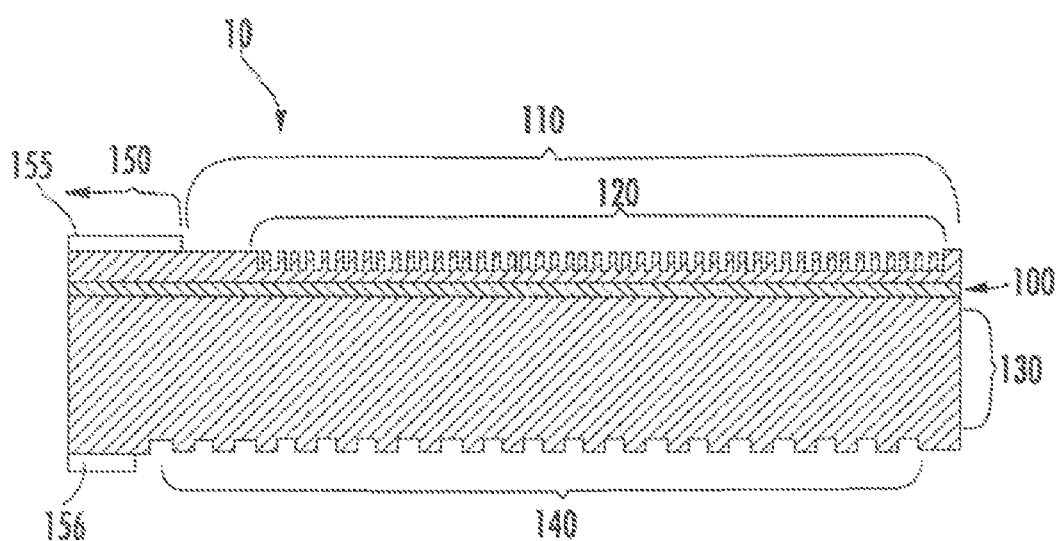

FIG. 1(a) shows a surface emitting device 10 having a pair of integrated gratings in the passive region 110 adjacent to gain section 150 of waveguide 100, according to an embodiment of the invention. Gain section 150 includes gain media. Waveguide 100 is disposed on substrate 130, such as a starting substrate. Substrate 130 has a refractive index of $n_s$. Although the emitting region of device 10 is not shown in FIG. 1, device can be either side or surface emitting. In a preferred embodiment of the invention, device 10 is surface emitting.

An out-coupling grating 120 is shown disposed on waveguide 100. Out-coupling grating 120 has a grating period $d_{out}$. A second grating 140 is shown formed from or on substrate 130. Grating 140 has a grating period of $d_{littrow}$. Grating 140 has a grating period short enough to provide operation in the Littrow condition. Grating 140 is hereafter referred to as TIR grating 140. Although both gratings shown in FIG. 1(a) are disposed in passive region 110, one or more of the gratings or other reflective/transmissive structure can be disposed on gain section 150. Moreover, although device 10 shown in FIG. 1(a) shows the out-coupling grating 120 and the TIR grating 140 on the same side of gain section 150, and being on opposite sides of the substrate 130, the invention is not limited to this arrangement.

The dispersive resolution of a grating is known to allow the selection of a single lasing cavity mode at a time to be reflected back into the external cavity. The effect of the groove pattern of a grating on the direction of light diffracted by it is governed by the grating equation shown below:

$$m\lambda = nd(\sin\alpha + \sin\beta) \quad (1)$$

where α is the angle of incidence, β the angle of diffraction, λ and m the wavelength and diffraction order, n is the refractive index of the media in which the light is propagating, and d the spacing between adjacent grooves on the grating surface. As used herein, light includes light beyond the visible spectrum, including the ultraviolet and the infrared.

The Littrow configuration is that specific grating geometry in which the light of a specific wavelength diffracted from a grating, into a given diffraction order, travels back along the direction of the incident light: in Eq. (1) above, this requires:

$$\alpha = \beta \text{ (the Littrow configuration)}. \quad (2)$$

With α=β the light gets coupled back into, not only the external cavity, but into the lasing cavity as well for feedback. For the Littrow configuration, the grating equation simplifies to:

$$m\lambda = 2dn \sin\alpha \quad (3)$$

"α" in the grating equation is generally referred to as the Littrow angle. Consequently, the wavelength diffracted into the laser is a function of, such that the dispersion plane remains perpendicular to the surface of the grating. Although the grating operated in the Littrow condition is capable of dispersing the incident light into a various number of diffraction orders, it is apparent to those having ordinary skill in the art that that the gain profile of the laser is narrow enough such that there is no second order light produced by the laser, since second order wavelengths would have values of $\lambda_1/2$. The same is true for subsequent orders, where $\lambda_m = \lambda_1/m$. Thus, the grating equation for the Littrow condition can be further simplified to: $\lambda = 2d \sin\alpha_L$, where m=1 only, and the first order diffracted wavelengths are sent back into the laser essentially exclusively.

The substrate 130 can be various semiconducting substrates such as Si, GaAS, InP, or GaN, or some insulating substrates. The material defining the laser waveguide and gain sections are preferably grown thereon. The starting substrate can be a laser epi wafer.

Gain region 150 of device 10 can include a p-n junction. In this embodiment, device 10 can be a grating-coupled surface-emitting laser (GCSEL). However, gain region 150 can also include a variety of other active layers, including a variety of solid amplifying medium. The gain region 150 may consist of a large optical cavity p-n junction, a single quantum well, multiple quantum wells, or quantum dots.

Contact layers to the p-side 155 and the n-side 156 which provide low resistance contacts for laser driver module (not shown) to drive device 10 are shown covering the gain region 150 in FIG. 1(a). Although device 10 will generally be electrically pumped and thus include low resistance electrical contacts, device 10 can also be optically pumped, such as using another laser and thus not require electrical contacts 155 and 156.

Waveguide section 100 has an effective refractive index of $n_{eff}$, which is higher than the adjacent cladding regions. Based on first order equations of diffraction gratings, light (with a wavelength of λ) propagating in the waveguide section 100 in the passive region 110 of device 10 which is incident on the out-coupling grating 120 which has a period $d_{out}$ will be diffracted at an angle of $\theta_1$ inside the substrate 130, according to:

$$n_s \sin\theta_1 + n_{eff} = \frac{m\lambda}{d_{out}}. \quad \text{Equation 4}$$

Given that $d_{out}$ is of the proper dimension and the refractive index of the material covering the grating $n_c$ is low enough m=1 will be the only diffracted order given that the following inequality:

$$d_{out} < \frac{\lambda}{n_c + n_{eff}} \quad \text{Equation 5}$$

is met.

The light diffracted from the out-coupling grating 120 will then be incident upon TIR grating 140, which has a period of $d_{littrow}$. Again from first order equation for diffraction gratings, the light diffracted by TIR grating 140 will be at an angle of $\theta_2$ according to:

$$n_s \sin\theta_1 + n_s \sin\theta_2 = \frac{m\lambda}{d_{littrow}}. \quad \text{Equation 6}$$

Given that $d_{littrow}$ is of the proper dimension as described below and the refractive index of the material covering grating 140 $n_c$ is low enough, m=0 and m=1 will be the only diffracted orders given that the following inequality:

$$d_{littrow} < \frac{\lambda}{n_s \sin\theta_1 + n_c} \quad \text{Equation 7}$$

is met. For the correct wavelength, $\lambda_{lock}$, the Littrow condition will be met and Eq. 6 will reduce to:

$$2 n_s \sin\theta_1 = \frac{\lambda_{lock}}{d_{littrow}}. \quad \text{Equation 8}$$

At $\lambda_{lock}$, light will be retroreflected by TIR grating 140. If the TIR grating 140 is of the correct depth, the diffraction efficiency into the m=0 order for the wavelength $\lambda_{lock}$ will be near zero. The m=1 retroreflected light will couple back into the out-coupling grating 120 and propagate back into the gain region 150 of the device 10. Combining Equations 4 and 8, the wavelength $\lambda_{lock}$ at which the double grating configuration provide by gratings 120 and 140 will provide feedback to the gain region 150 of the semiconductor device 10 given by:

$$\lambda_{lock} = \frac{2 d_{out} d_{littrow}}{2 d_{littrow} - d_{out}} n_{eff}. \quad \text{Equation 9}$$

The resulting $\lambda_{lock}$ provided by the double grating configuration of device 10 is quite narrow, such as 0.12 nm, or less, as described in the Examples below from actual devices fabricated. As noted above and in examples provided below, out-coupling perturbation can be replaced by a mirror, such as a MEMS turning mirror (see FIGS. 2(a)-(c) described below), while TIR grating can be replaced by alternate structures including integrated prisms for providing feedback (see FIG. 1(k) described below). Such alternate arrangements are also expected to provide narrow wavelength locks.

Figure 1B:
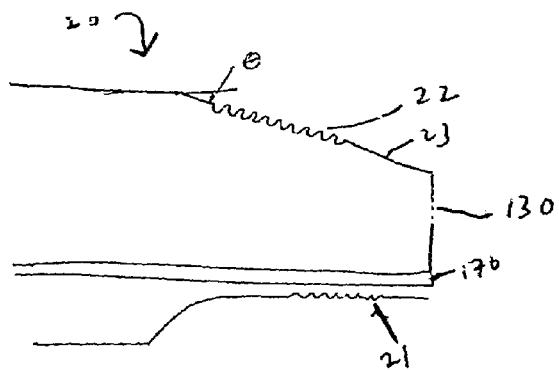
FIGS. 1(b)-(k) show some exemplary alternate embodiments of integrated light emitting semiconductor devices having integrated feedback for wavelength locking according to the invention.

FIGS. 1(b)-(k) shows some exemplary alternate embodiments of integrated light emitting semiconductor devices having integrated feedback for wavelength locking according to the invention. FIG. 1(b) shows surface emitting device 20 having a pair of integrated gratings. An out coupling grating 21 is disposed adjacent to waveguide/gain media 170. On the other side of starting substrate 130, a TIR grating 22 is disposed. The TIR grating 22 provides feedback and can be partially transmissive. Having a partially transmissive TIR grating 22 can maintain a high quality resonator while also emitting light, provide outcoupling grating 21 disposed on the opposing end of the resonator is highly reflective. TIR Grating 22 can be made partially transmissive through design of one or more parameters including period, depth, and duty cycle so that TIR grating 22 does not strictly operate under TIR conditions. The out-coupling grating 21 may also need to be modified to provide partially transmissive operation. EM modeling may be used to find appropriate grating parameters to achieve partially transmissive grating operation. In one embodiment, transmitted light from TIR grating 22 embodied as a partially transmissive grating can be used as an output for a temperature control circuit (not shown) to further control lasing wavelength stability of devices according to the invention.

The TIR grating 22 is shown in FIG. 1(b) is formed on a tilted surface 23 of substrate 130, with the tilted surface 23 being at an angle of θ with respect to un-etched surface of substrate 130. Changing θ changes the locking wavelength of device 20. The configuration shown in FIG. 1(b) can be used to create a partially transmitted configuration described above without changing out-coupling grating 21.

Figure 1C:
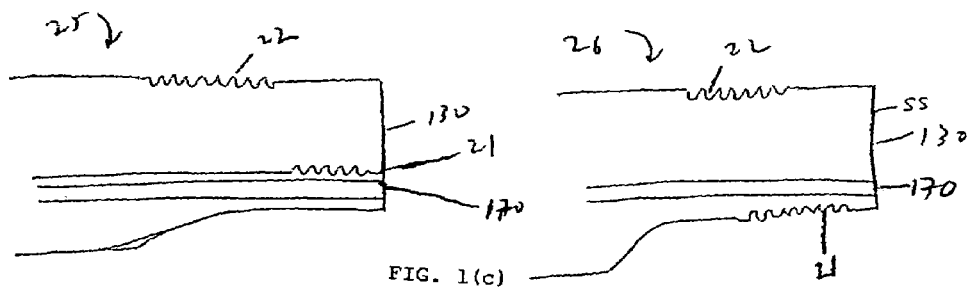
Figure 1D:
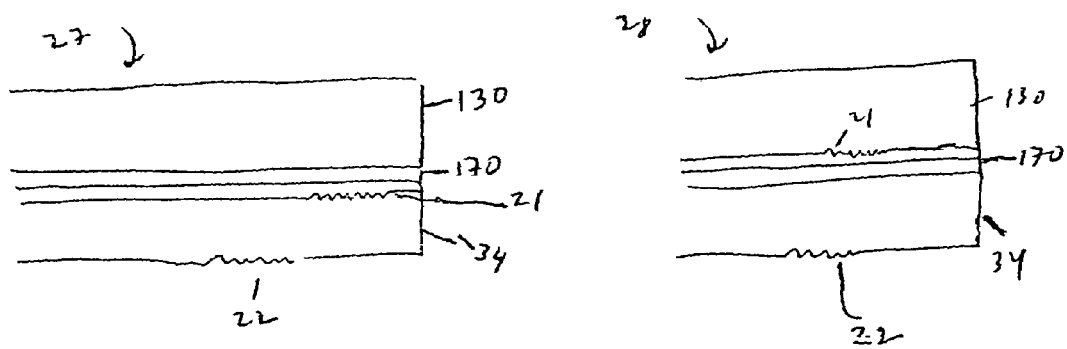

FIG. 1(c) shows surface emitting devices 25 and 26 having a pair of integrated gratings comprising TIR grating 22 and out-coupling grating 21. FIG. 1(d) shows surface emitting device 27 and 28 having a pair of integrated gratings comprising TIR grating 22 and out-coupling grating 21, where the TIR grating 22 is formed on epitaxial layer 34, rather than on substrate 130.

Figure 1E:
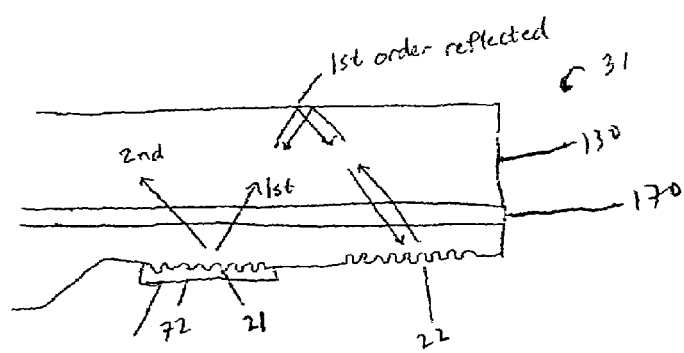

FIG. 1(e) shows surface emitting device 31 having a pair of integrated gratings comprising TIR grating 22 and out-coupling grating 21. Out coupling grating is shown having an optional highly reflective coating 72 thereon. As shown in FIG. 1(e), the respective gratings are configured and optically aligned so that only m=1 light becomes amplified. Out-coupling grating 21 functions as a dispersive element steering away m=2 light, for example, as shown.

Figure 1F:
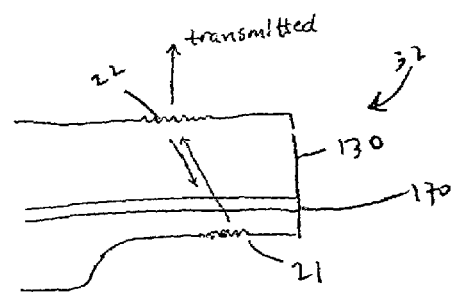

FIG. 1(f) shows surface emitting device 32 having a pair of integrated gratings comprising TIR grating 22 and out-coupling grating 21. TIR grating 22 is optionally configured as shown to be partially transmissive to permit some light to be transmitted therethrough. The out-coupling grating 21 can also emit some light, while the remainder can be coupled back into the resonator. Depending on the function desired, out-coupling grating 21 can provide light output for device 32, where part of the light is transmitted into the air. If a highly reflective out-coupling grating 21 is desired, although not shown in FIG. 1(f), a high-reflective coating layer, analogous to high-reflective coating layer 72 shown in FIG. 1(e) can be used.

Figure 1G:
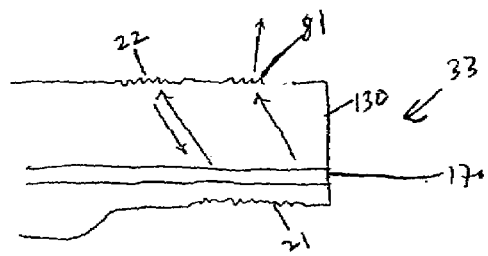

FIG. 1(g) shows surface emitting device 33 having a pair of integrated gratings comprising TIR grating 22 and out-coupling grating 21, together with a second TIR grating, TIR grating 81. In this configuration, TIR grating 22 retroreflects without any significant transmission, while TIR grating 81 is substantially transmissive. Using different grating parameters (e.g. etch depth, duty cycle, period), TIR gratings 22 and 81 can provide different wavelength selectivities.

Figure 1H:
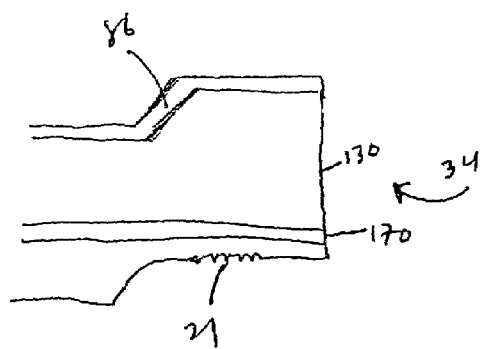

FIG. 1(h) shows surface emitting device 34 having a tilted plane for providing feedback 86 and an out-coupling grating 21. An optional highly reflective coating on tilted plane 86 can provide a substantially reflective response, while titled plane 86 is substantially transmissive without a highly reflective coating.

Figure 1I:
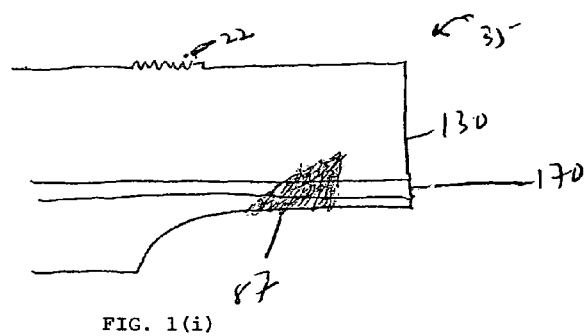

FIG. 1(i) shows surface emitting device 35 having TIR grating 22 and an implanted perturbation 87 which functions as an out-coupling. Implanted perturbation 87 extends through waveguide/gain media 170 into starting substrate 130. Ion implantation can be used to introduce a localized change in the index of refraction to form a dielectric perturbation. (See Andreas et al. entitled "Modification of the refractive index of lithium niobate crystals by transmission of high-energy $^4He_2^+$ and $D^+$ particles, Appl. Phys. Lett., Vol. 84, No. 19, 10 May 2004, 3813-3815).

Figure 1K:
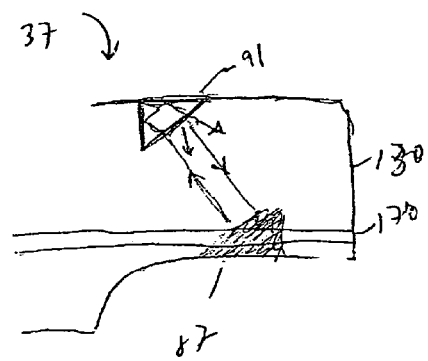
Figure 1J:
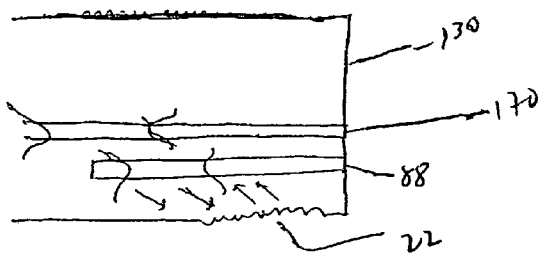

FIG. 1(j) shows surface emitting device 36 having TIR grating 22 and a leaky mode waveguide 88 to function as an out-coupling. Published U.S. Application No. 20050008294 to Park which provides a description of leaky mode waveguides is incorporated by reference into the present application for its disclosure regarding leaky mode waveguides. Light from TIR grating 22 is transferred to the leaky mode waveguide 88 which couples back to the waveguide/gain media 170. The Gaussian-like traces shown in leaky mode waveguide 88 and waveguide/gain media 170 represent light coupling from waveguide 88 to waveguide/gain media 170.

FIG. 1(k) shows surface emitting device 37 having an integrated prism 91 for feedback and an implanted perturbation 87 to function as an out-coupling. Integrated prism can be formed using ion implantation to form a graded index and/or variable index of refraction for transforming the incident light as noted above.

For example, the device can further include a reflective/transmissive arrangement disposed on the side of the gain section opposite the out-coupling grating 120 and TIR grating 140 shown in FIG. 1(a). The reflective/transmissive arrangement can comprise another out-coupling grating, a cleaved facet, the outcoupling grating and TIR grating combination shown in FIG. 1, or the outcoupling grating and TIR grating combination shown in FIG. 1 followed by an out-coupling grating.

Figure 2A:
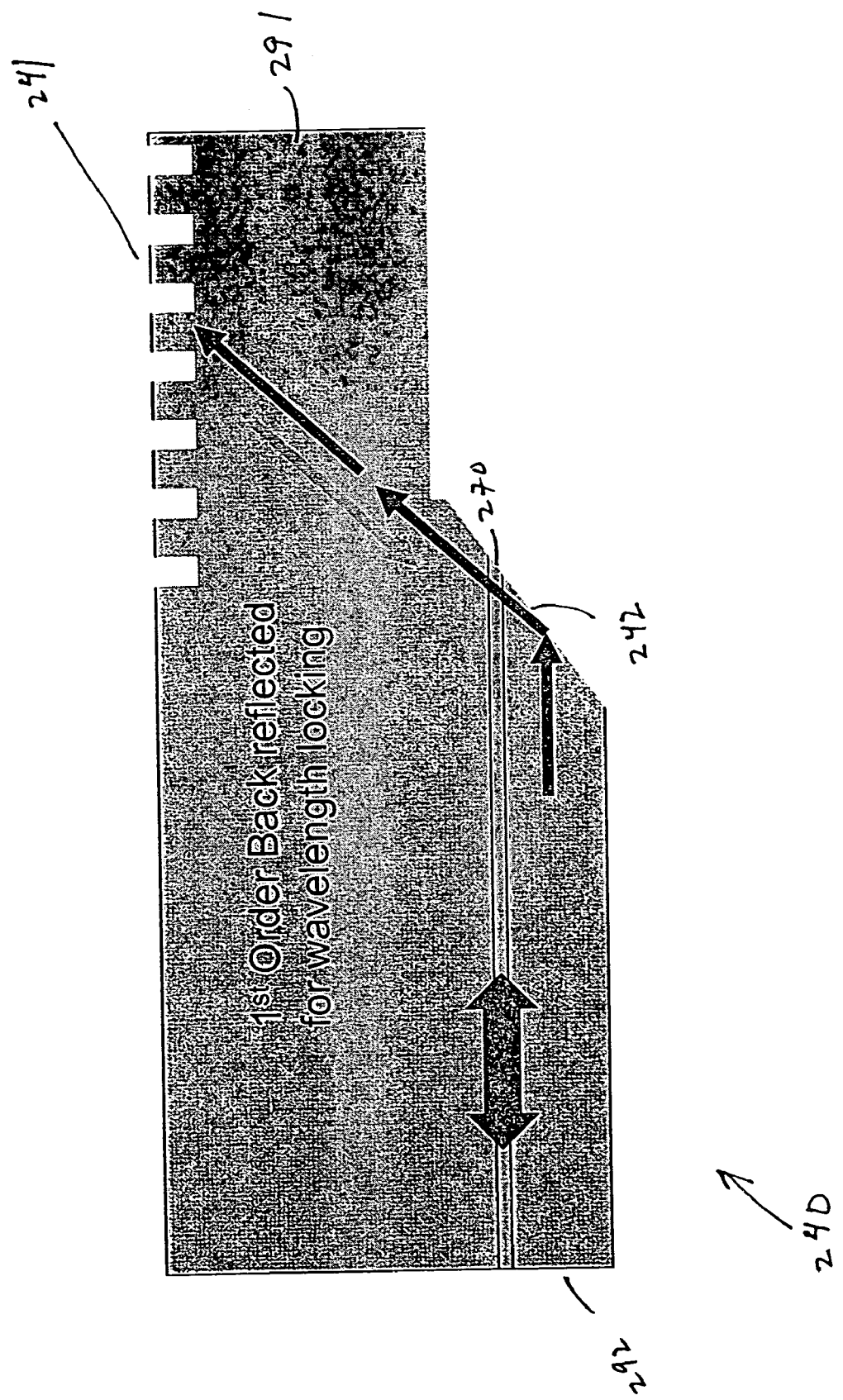
FIGS. 2(a)-(c) show cross sectional views of alternate embodiments of the invention which include a TIR grating together with a micromachined turning mirror.
Figure 2B:
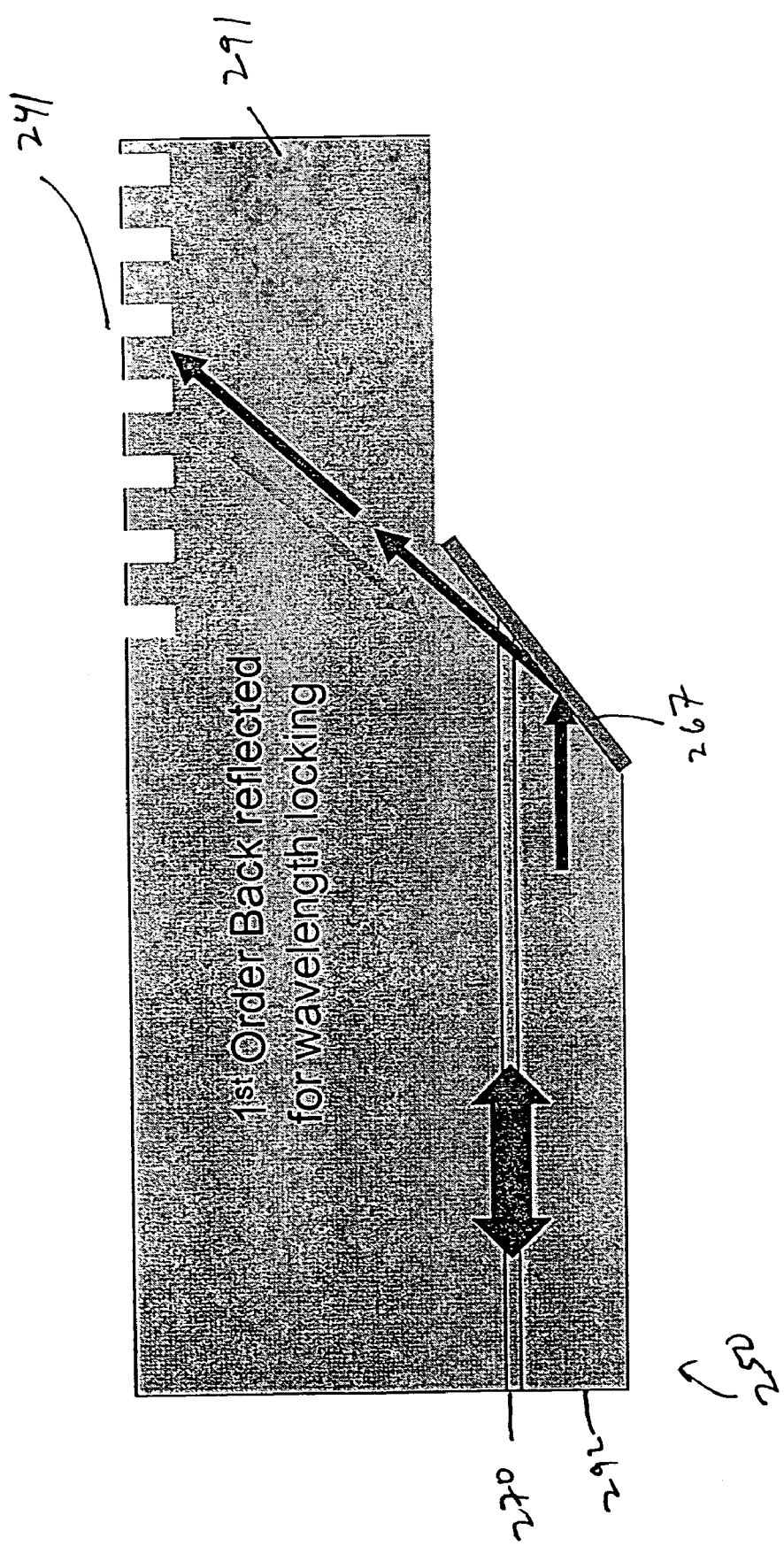
Figure 2C:
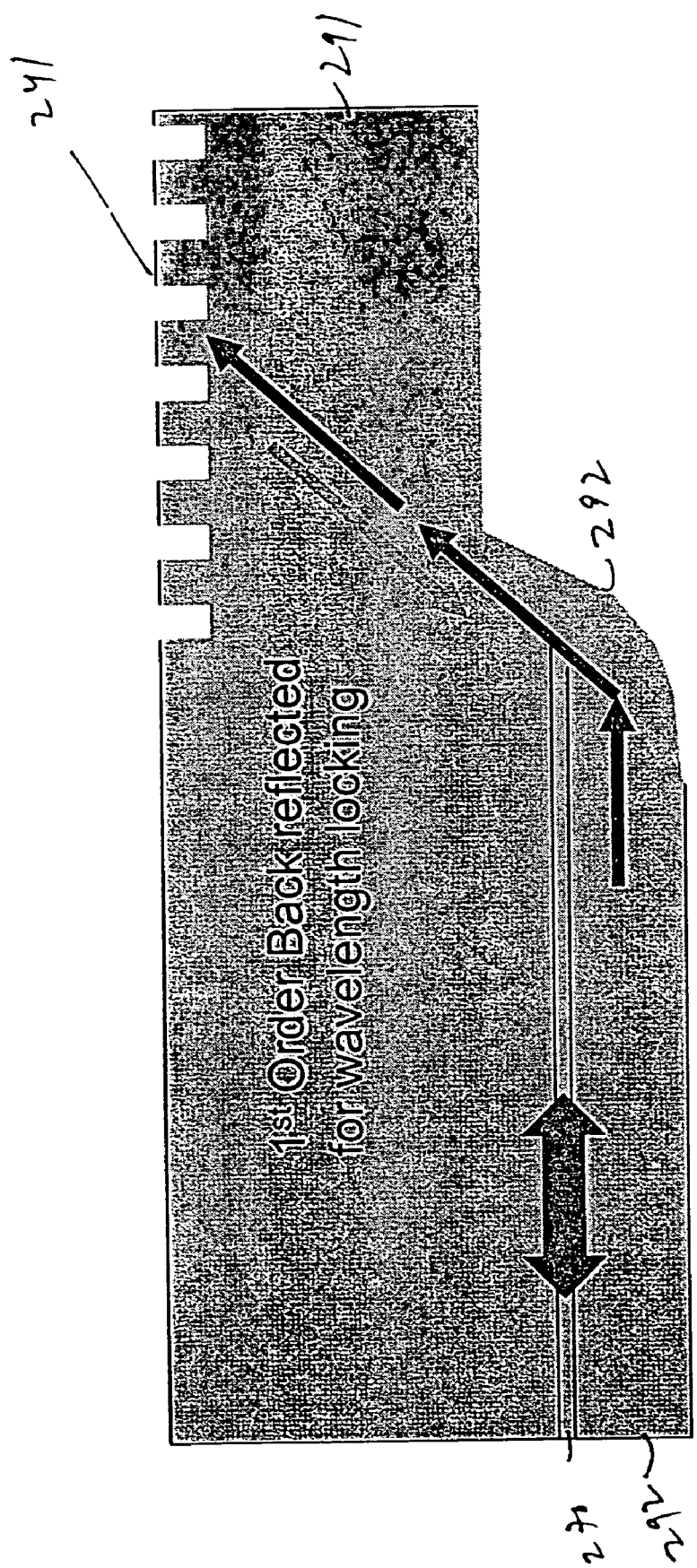

FIGS. 2(a)-(c) show alternate embodiments of the invention which include a TIR grating 241 together with a MEMS turning mirror 242, according to the invention. Device 240 shown in FIG. 2(a) is formed from a laser epi substrate comprising n-side 291, p-side 292, and waveguide/gain media 270 near the p-n junction region provided. TIR grating 241 back reflects m=1 light, while scattering other orders of light. MEMS turning mirror 242 is formed on the p-side 292 and as shown in FIG. 2(a) and directs light from the waveguiding layer 270 to TIR grating 241. The turning mirror 242 can be simply formed by removing material such that the facet of the waveguide 270 has a slanted facet on its end. The mode of emission of device 240 is determined by the structure on the side of waveguide/gain media 270 opposite turning mirror 242.

Device 250 shown in FIG. 2(b) is analogous to device 240 shown in FIG. 2(a), except device 250 adds a reflective coating layer 267 for enhanced reflection towards TIR grating 241. Coating layer can comprise a dielectric coating, such as an oxide coating or silicon nitride coating. A thin layer, such as 100 nm to 1 µm, can be used for this purpose. An additional benefit of this arrangement is to reduce the surface scattering associated with the facet forming the turning mirror. Device 290 shown in FIG. 2(c) is analogous to device 240 shown in FIG. 2(a), except flat micromachined turning mirror 242 is replaced a micromachined turning mirror 292 having a curved surface for further enhancing reflection from p-side 292 to TIR grating 241.

Figure 3:
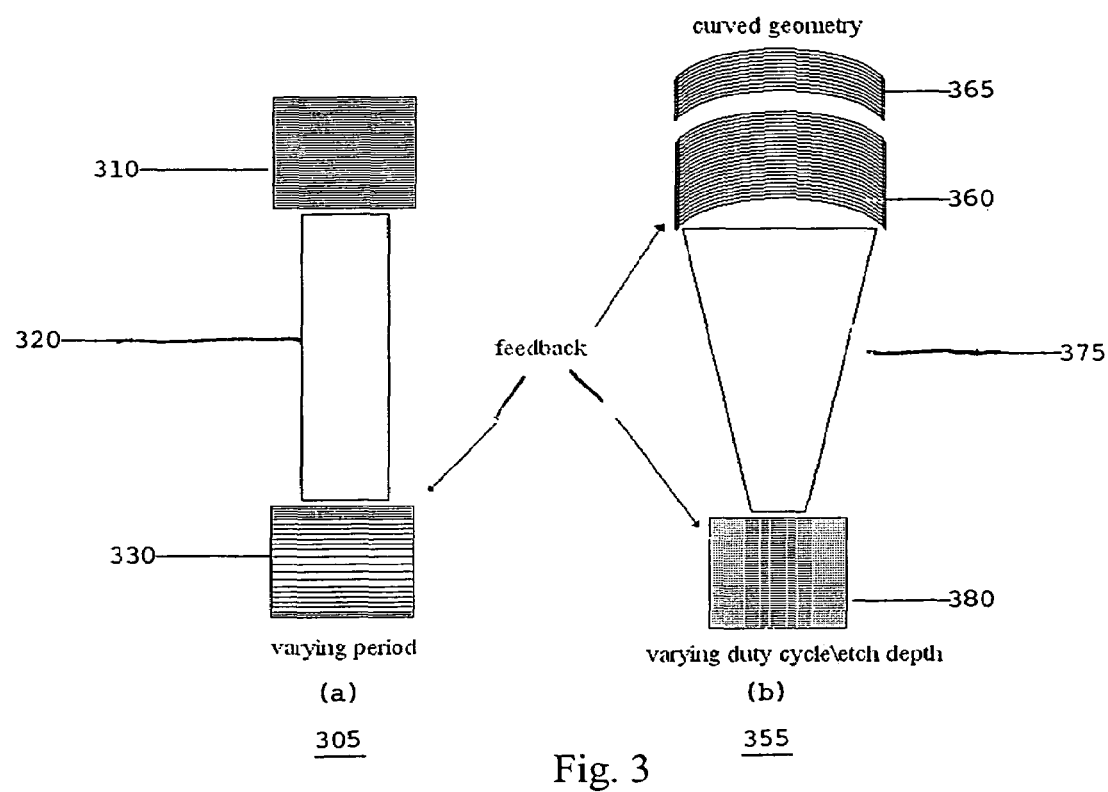
FIG. 3 shows some possible spatial variations of gratings, straight and curved geometries of gratings, and device configurations.

FIG. 3(a) shows a light emitting device 305 having a second out-coupling grating 310 disposed on a side of the gain region 320 opposite to the TIR grating and first out-coupling grating (collectively 330) which are disposed on the other side of gain region 320. The first out-coupling grating will generally be on the opposing sides of the gain region 320 relative to the second out-coupling grating 310, but on the same side of the substrate. At least one of the first TIR grating and out-coupling grating comprising grating 330 have varying grating periods to provide feedback for more than one wavelength.

FIG. 3(b) shows a light emitting device 355 which includes a reflective arrangement disposed on side of the gain section 375 opposite the out-coupling grating and the TIR grating (collectively 380) which comprises another outcoupling grating and TIR grating (collectively 360) by yet another out-coupling grating 365. The out-coupling grating and the TIR grating (collectively 380) include varying duty cycle and/or etch depth. Spatial variations in the grating, such as by varying etch depth, duty cycle, period, and/or curvature, can reduce the light initially scattered into the active region from the out-coupling grating, or can spatially condition the light reflected into the device.

Figure 4:
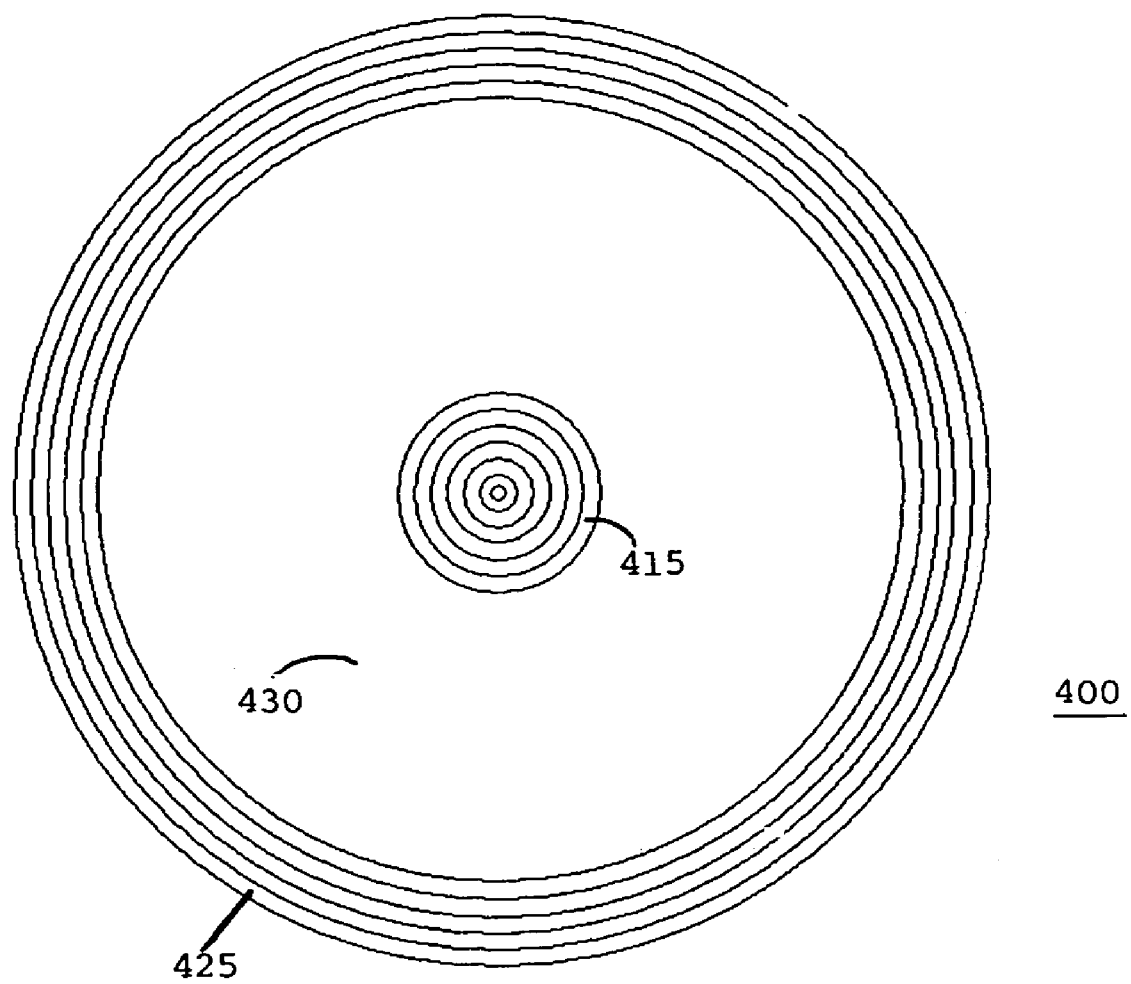
FIG. 4 shows a circular semiconductor device geometry having a circular TIR and out-coupling grating arrangement.

The curvature of the out-coupling grating and TIR grating can be in a curved arrangement including a circular arrangement. FIG. 4 shows a semiconductor laser 400 featuring a circular arrangement including out-coupling grating 425 and TIR grating 415 in the passive region of the device according to the invention disposed opposite sides of gain region 430. In this arrangement, the out-coupling grating 425 may include spatial variations (i.e. etch depth, duty cycle, period, and/or curvature) to reduce the light initially scattered into the active region 430, or to spatially condition the light reflected into the device 400.

An exemplary fabrication sequence for a double grating diode laser device according to the invention is now presented. A wafer substrate is provided. A waveguide region is deposited on the substrate. A gain region including a p-n junction is formed to form an in-plane light emitting semiconductor device. Electrical contact layers are preferably provided for both the n-side and p-side of the junction. The out-coupling grating 120 and TIR grating 140 shown in FIG. 1(a) are both then formed using lithographic methods. Either the coupling grating 120 or TIR grating 140 can be fabricated first. If gratings 120 and 140 are formed through using lithographic methods, the method preferably comprises writing the pattern of the grating in a resist using an electron beam source, followed by a transfer etch process to create the grating in the semiconductor n- or p-material.

EXAMPLES

The present invention is further illustrated by the following specific Examples, which should not be construed as limiting the scope or content of the invention in any way.

Figure 5:
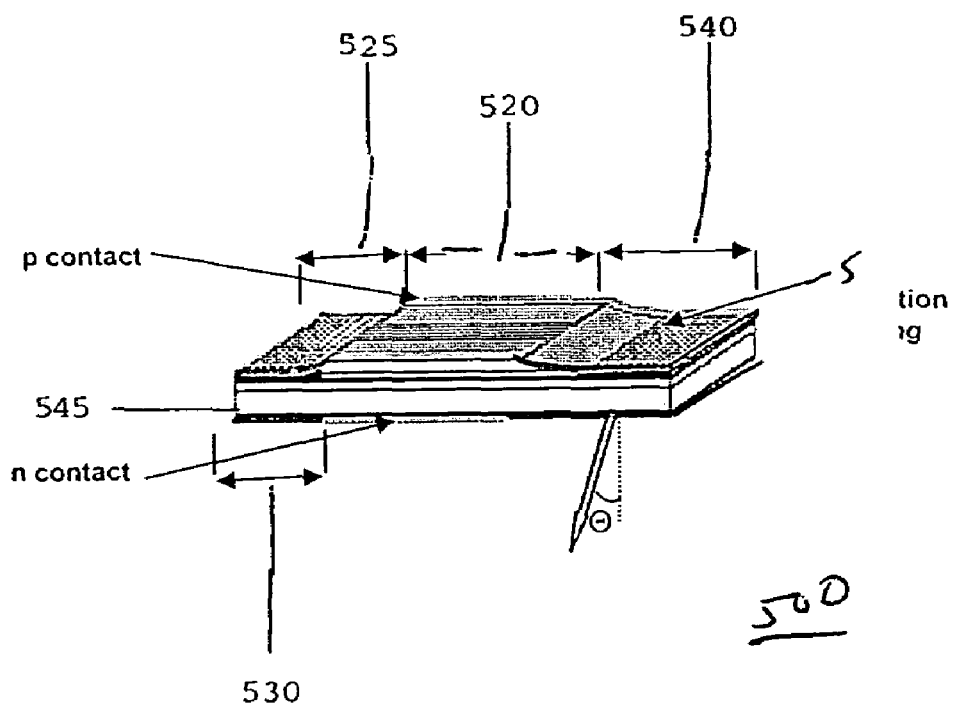
FIG. 5 shows a schematic for a grating-coupled surface-emitting laser (GCSEL) according to an embodiment of the invention which was fabricated and tested.

An exemplary semiconductor laser according to the invention was device was designed, fabricated, and tested. FIG. 5 shows a schematic of the GCSEL device 500 fabricated and tested. Device 500 was fabricated using a GaAs epi laser substrate 545 having an estimated waveguide effective refractive index of 3.23. On one side of the gain section 520 of the device in the passive region a short-periodicity out-coupling grating 525 was fabricated on the p-side of device 500 while a TIR grating 530 was built on the n-side. The epi substrate 545 provided a typical broad gain region extending from approximately 965 nm to 985 nm, with a peak gain near 975 nm.

The period of the out-coupling grating 525 was 220 nm. A second out coupling grating 540 was disposed in the passive region on p-side on the side of the gain section 520 opposite to the out-coupling grating 525 and TIR grating 530 to allow for higher optical power from the device 500. Out-coupling grating 540 had a grating period of 270 nm and was covered by a highly reflective coating 560 comprising a 130 nm layer of SiNH followed by a layer of 250 nm layer of Au.

Devices using two different periods for the TIR grating 530 were tested, 400 nm and 410 nm. GCSELS 500 formed using a 400 nm period TIR grating 530 provided a calculated locking wavelength of 980 nm, while for the 410 nm periodicity of TIR grating 530, the calculated locking wavelength was 971 nm.

Figure 6:
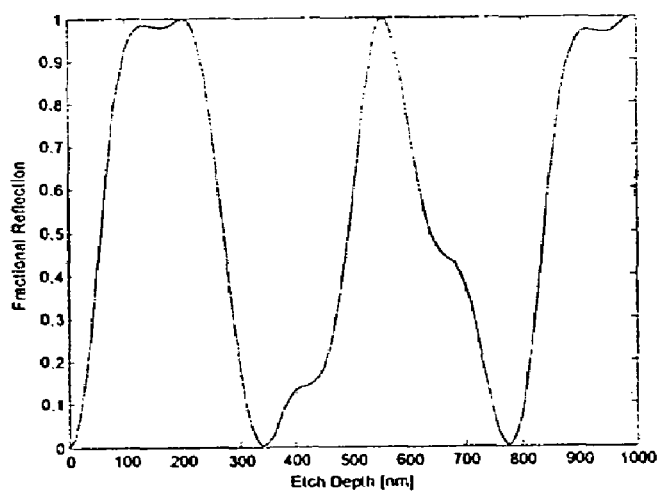
FIG. 6 shows fractional reflection calculated using coupled mode theory for a 410 nm period TIR grating operating under total internal reflection condition in GaAs for an angle of incidence of 19.8° and a wavelength of 980 nm as a function of the grating depth.

As noted above, TIR grating 530 preferably has feature dimensions to maximize feedback reflectivity, including feature height. Referring to the device 500 shown in FIG. 5, the feature height is defined by the depth at which the TIR grating 530 is formed (e.g. etched) in the substrate 515. The reflection from the TIR grating for TE polarization was calculated using coupled mode theory as a function of etch depth for an incident angle in GaAs of 19.8°, a grating period of 410 nm, a 50% duty cycle, a wavelength of 980 nm, and an internal refractive index of 3.52 is shown in FIG. 6. As can be seen, there is a significant range for several nominal etch depths for which the reflection for the TIR grating is near unity, such as about 100 to 200 nm, 540 to 560 nm, and 900 to 980 nm. This data evidences the significant fabrication tolerance provided by the invention as compared to DBR based wavelength locking.

Experimental Results

The devices fabricated were tested under pulsed pumping conditions to limit device heating. The lasing threshold, locking wavelength, spectral line width, and wavelength shift versus temperature were all measured. The duration of the current pulse used was 500 ns and the repetition rate used was in the range of (1-10) kHz.

The peak optical power versus the current amplitude was measured at 20° C., and the threshold current density was determined to be in the range of (50-1200) A/cm$^2$ depending on the area of active section 520. For a device with a 100 μm-wide by 4 mm-long active section, the threshold current density was 75 A/cm$^2$. The relatively high threshold was believed to result from the somewhat low resonator quality due to the effective reflection from the 270 nm-periodicity out-coupling grating 440 being low.

The lasing spectral characteristics were measured at a pump current above the threshold and at a temperature of 20° C. The locking wavelengths were determined to be (979.5±1.9) nm and (972.2±2.4) nm for lasers with the 400 nm and the 410 nm TIR gratings, respectively. The line width for both types of devices was about 0.12 nm. The accuracy of these measurements were limited by the lowest bandwidth resolution of the optical spectrum analyzer (OSA) used for the measurements which was about 0.06 nm. The normalized OSA data for the above measurements are shown in FIG. 7.

Temperature dependence of both the lasing threshold and the spectral characteristics of the devices were also measured. FIG. 8 presents the data obtained from a 100 μm-wide by 4 mm-long device with a 410 nm-periodicity TIR grating 530. For all devices measured, the change in lasing wavelength relative to temperature was 0.1 nm/° C., which matches the known temperature coefficient characteristics for DBR lasers. Following the measured lasing threshold characteristics, a slow increasing in the threshold was observed in the temperature range of (10-40)° C. and a sharp rise in threshold for higher temperatures. This effect is believed to be related not only to the standard emission power decrease with temperature but also to the large difference in the "red shift" gain to the lasing wavelength.

This invention can be embodied in other forms without departing from the spirit or essential attributes thereof and, accordingly, reference should be had to the following claims rather than the foregoing specification as indicating the scope of the invention.

We claim:

1. An integrated light emitting semiconductor device having integrated feedback for wavelength locking, comprising:
    a semiconductor substrate including a waveguide region having a gain section, said gain section having a gain media therein;
    an out-coupling patterned grating having first grating parameters integrated with said device and disposed on a topside or a bottomside of said substrate proximate to said waveguide, and
    a total internal reflection (TIR) patterned grating having second grating parameters that are different from said first grating parameters for providing optical feedback integrated with said device and disposed on an opposite side of said substrate relative to said out-coupling grating.

2. The device of claim 1, wherein said TIR grating has a first grating period and said out-coupling gating has a second grating period, wherein said first grating period is different from said second grating period.

3. The device of claim 1, wherein said out-coupling grating has a grating period small enough to allow for essentially only the +1 diffracted order to propagate in said device.

4. The device of claim 1, wherein said gain section includes a p-n junction, said device comprising a laser diode.

5. The device of claim 1, wherein said grating parameters comprise at least one selected from the group consisting of curvature, feature shape and angle relative to one another.

6. The device of claim 1, wherein both said out-coupling grating and said TIR grating are curved.

7. The device of claim 1, wherein a period of at least one of said out-coupling grating perturbation and said TIR grating structure include at least two different periods, wherein said device provides a wavelength dependent phase and at least two different wavelength are retroreflected back into said gain section.

8. The device of claim 1, wherein at least one of the said out-coupling grating perturbation and said TIR grating structure include spatial variations, said spatial variations comprising variations in at least one of etch depth, period, an duty cycle, to spatially condition a beam reflected back into a laser cavity of said device.

9. The device of claim 1, wherein said device is a grating-coupled surface-emitting laser.

10. The device of claim 1, further comprising a highly reflective coating layer disposed on said out-coupling grating perturbation.

11. The device of claim 1, wherein said gain section includes quantum dots or at least one quantum well.

12. The device of claim 1, wherein said TIR grating comprises a surface relief diffraction grating having at least one grating period that is large enough to support multiple diffracted orders such that for each of said grating periods provided by said TIR grating an essentially discrete wavelength locked wavelength ($\lambda_{lock}$) is retroreflected back toward said out-coupling grating.

13. The device of claim 12, wherein said $\lambda_{lock}$ is given by:

$$\lambda_{lock} = \frac{2 d_{out} d_{littrow}}{2 d_{littrow} - d_{out}} n_{eff}$$

wherein $d_{out}$ is said grating period of said outcoupling grating, $d_{littrow}$ is said grating period of said TIR grating and said $n_{eff}$ is a refractive index of said waveguide region.

14. The device of claim 1, wherein said out-coupling grating is located on said topside of said substrate and said TIR grating is located on said bottomside of said substrate.

15. The device of claim 1, wherein said out-coupling grating has a periodicity greater than a periodicity of said TIR grating.

16. The device of claim 1, wherein said semiconductor substrate comprises an epi substrate having an n-side and p-side, said outcoupling grating on said p-side and TIR gating on said n-side.

* * * * *